United States Patent [19]
Schoofs

[11] Patent Number: 5,387,882
[45] Date of Patent: Feb. 7, 1995

[54] SWITCHED CAPACITOR CHARGE PUMP AND SAWTOOTH OSCILLATOR USING SAME

[75] Inventor: Franciscus A. C. M. Schoofs, Eindhoven, Netherlands

[73] Assignee: U.S. Philips Corporation, New York, N.Y.

[21] Appl. No.: 216,122

[22] Filed: Mar. 22, 1994

Related U.S. Application Data

[63] Continuation of Ser. No. 56,502, May 3, 1993, abandoned.

[30] Foreign Application Priority Data

Jun. 15, 1992 [NL] Netherlands ............... 9201053

[51] Int. Cl.⁶ .................. H03K 3/023; H03K 3/354
[52] U.S. Cl. ........................... 331/111; 331/143; 327/77; 327/131
[58] Field of Search ............. 331/111, 143; 307/494, 307/496, 497; 328/63

[56] References Cited

U.S. PATENT DOCUMENTS 4,644,300 2/1987 Ibe et al. .................. 331/111
4,792,705 12/1988 Ouyang et al. ............ 331/111 X

FOREIGN PATENT DOCUMENTS 60-19313 1/1985 Japan.

OTHER PUBLICATIONS

IEEE, vol. 71, No. 8, Aug. 1983, pp. 941–965, R. Gregorian et al., "Switched-Capacitor Circuit Design".
U. Tietze Ch. Schenk 'Halbleiter-Schaltungstechnik' 1980, Springer Verlag Berlin Heidelberg N.Y., pp. 444–450.

*Primary Examiner*—Siegfried H. Grimm
*Attorney, Agent, or Firm*—Laurie E. Gathman

[57] ABSTRACT

Charge pump including: a capacitor (4) which includes a first capacitor terminal (2) and a second capacitor terminal (8), a discharge switch (20) for discharging the capacitor (4) by the closing and opening of the discharge switch (20) in response to a first or second value respectively, of a clock signal (CS), a first current source (6) for supplying a first current (I1) to the first capacitor terminal (2), a comparator (12) whose first input (10) is connected to the first capacitor terminal (2) and whose second input (14) is connected to a reference voltage source (16) and which comparator generates a comparison signal (Vcomp) of which a first or second value denotes that the voltage (Vc) on the first input (10) is smaller or larger than the voltage on the second input (14), a current switch (24) passing a second current (I2) coming from the second current source (34) to an output terminal (28) once the clock signal (CS) has changed from the first to the second value, and prevents the second current (I2) flowing to the output terminal (28) once the comparison signal (Vcomp) has changed from the first to the second value. A sawtooth oscillator is formed by using the charge pump as a timing circuit with the oscillator providing the clock signal, and the second current from the output terminal being fed back to the first capacitor terminal.

11 Claims, 4 Drawing Sheets

SWITCHED CAPACITOR CHARGE PUMP AND SAWTOOTH OSCILLATOR USING SAME

This is a continuation of application Ser. No. 08/056,502, filed May 3, 1993 and now abandoned.

BACKGROUND OF THE INVENTION

1. Field of the Invention

The invention relates to a switched capacitor charge pump including a capacitor having a first capacitor terminal and a second capacitor terminal, a charging device coupled to the first capacitor terminal, for charging the capacitor, a discharge switch coupled to the first and the second capacitor terminal, for recurrently discharging the capacitor by the closing and opening of the discharge switch in response to a first or second value respectively, of a binary cyclic clock signal from a clock signal source.

The invention likewise relates to a sawtooth oscillator including such a switched capacitor charge pump.

2. Description of the Prior Art

A switched capacitor charge pump of this type is known from Proceedings of the IEEE, Vol. 71, No. 8, August 1983, pp. 941-965, R. Gregorian et al., "Switched-Capacitor Circuit Design", FIG. 1(b). The charging device in this paper is a switch capable of connecting the first capacitor terminal to a first voltage source which carries voltage V1. The second capacitor terminal is connected to a second voltage source which carries voltage V2. In each cycle of the clock signal the capacitor is first discharged by the discharge switch and then charged to a voltage difference V1-V2. In the cycle time interval T a charge dQ equal to C*(V1-V2) where C is the capacitance of the capacitor, is flowing. When the capacitor is being charged, the first voltage source is loaded, so that the voltage V1 and hence the charge dQ changes. The loading of the first voltage source may be reduced by a buffer stage i.e. a first operational amplifier arranged as a voltage follower. The second voltage source is usually the inverting input of a feedback second operational amplifier whose noninverting input is connected to the second voltage V2. The output of the second operational amplifier supplies a signal which is a measure for the charge dQ. The second voltage source carrying voltage V2 could be omitted by selecting this voltage to be equal to ground potential. However, in that case a supply voltage which is negative relative to ground potential will have to be available to the second operational amplifier. The realization of an accurate charge pump i.e. an arrangement supplying on its output a predetermined charge dQ in each cycle interval T thus turns out not to be of a simple kind.

SUMMARY OF THE INVENTION

It is an object of the invention to provide a switched capacitor charge pump in which the above objections are met.

According to the invention a switched capacitor charge pump of the type mentioned in the opening paragraph is characterized, in that: the charging device includes a first current source coupled to the first capacitor terminal for supplying a first current to the capacitor, and in that the switched capacitor charge pump further includes: a reference voltage source, a comparator having a first input connected to the first capacitor terminal, having a second input connected to the reference voltage source and having an output for supplying an essentially binary comparison signal of which a first and a second value respectively, denote that the voltage on the first input is smaller and larger respectively, than the voltage on the second input, a second current source for supplying a second current, an output terminal, a current switch for passing the second current to the output terminal in response to a transition from the first value to the second value of the clock signal and for preventing the second current flowing to the output terminal in response to a transition from the first to the second value of the comparison signal.

The first current source charges the capacitor with the first current I1, while the current switch passes the second current I2 to the output. When the voltage on the capacitor is equal to the reference voltage Vref of the reference voltage source, the current switch prevents the second current I2 from reaching the output. In this manner the output presents a current pulsating in timing with the clock signal and producing a charge $dQ=(I2/I1)*C*Vref$ in the time interval T of the clock signal. The reference voltage source is hardly loaded or not loaded at all by the comparator. A buffer is not necessary. The relation between the currents I2 and I1 may be accurately defined during design, certainly in the case of an integrated version. The first capacitor terminal may be connected to earth and the current switch may comprise a current router for which no negative supply voltage relative to earth is necessary.

The comparator and the current switch may be realized in various ways. A first embodiment of a switched capacitor charge pump according to the invention is thereto characterized, in that the comparator and the current switch comprise: a first and a second transistor arranged as a differential pair, and a third transistor, each transistor comprising a first main electrode, a second main electrode and a control electrode, the first main electrodes of the first and second transistors being coupled to the second current source, the control electrodes of the first and second transistors to the first capacitor terminal and the reference voltage source respectively, the second main electrode of the second transistor to a first terminal for producing a fixed potential, the second main electrode of the first transistor to the output terminal, and the first main electrode, the second main electrode and the control electrode of the third transistor being coupled to the second main electrode of the first transistor, a second terminal for producing a fixed potential, and the clock signal source respectively.

The differential pair combines the functions of comparator and current switch. Consequently, the charge pump is not only very simple but also very fast. When the second transistor takes over the second current from the first transistor, the current switch function is not performed stepwise, but in a gradual manner. However, this is no objection. Viewed over a period of time T the charge dQ remains the same. The third transistor passes the current through the first transistor to the second terminal with a fixed potential during discharging of the capacitor by the discharge switch. If the charge pump is used for charging a further capacitor, this further capacitor would be discharged by the third transistor. This may be avoided by a second embodiment of a switched capacitor charge pump according to the invention, in which the output is coupled to the second main electrode of the first transistor across a diode. The diode prevents the further capacitor from being discharged. The same effect may be realized with a third embodiment of a switched capacitor charge pump according to the invention, characterized in that the comparator and the current switch comprise: a first and a second transistor arranged as a differential pair, and a third transistor, each transistor having a first main electrode, a second main electrode and a control electrode, the first main electrodes of the first and second transistors being coupled to the second current source, the control electrodes of the first and second transistors to the first capacitor terminal and the reference voltage source respectively, the second main electrode of the second transistor to a first terminal for producing a fixed potential, the second main electrode of the first transistor to the first main electrode of the third transistor, and the second main electrode and the control electrode of the third transistor being coupled to the output terminal and the clock signal source respectively.

The third transistor is now combined in series with the first transistor, so that any discharging of a further capacitor is avoided.

The switched capacitor charge pump according to the invention may now be used for all kinds of purposes. Capacitors can be charged with this charge pump by relatively small charge portions without the use of current sources that carry absolutely small current values. For that matter, in the above formula for dQ only the relation between the second current I2 to the first current I1 plays a role. The mean value of the output current of the charge pump may be determined by the selection of the ratio I2/I1, the time interval T and thus also the frequency $f=1/T$ of the clock signal, the capacitance C of the capacitor and/or the value Vref of the reference voltage. Long time-constants may thus be realized, for example, in control loops for voltage-controlled oscillators.

The switched capacitor charge pump is pre-eminently suitable for use in a sawtooth oscillator which comprises: a capacitor having a first capacitor terminal and a second capacitor terminal, a first transistor arranged as a current source, a main conduction path thereof being coupled to the first capacitor terminal for charging the capacitor, a first discharge transistor including a first and a second main electrode which are coupled to the second and the first capacitor terminal respectively, and including a control electrode connected for receiving a binary cyclic clock signal for recurrently discharging the capacitor by rendering the first discharge transistor conductive and nonconductive in response to a first or second value respectively, of the clock signal, and a device for generating the clock signal in response to a voltage across the capacitor.

Sawtooth oscillators of this type are used, for example, in timer circuits. The device for generating the clock signal may in practice be arranged in various ways but they always include a comparator which compares the voltage across the capacitor with the reference voltage and generates a discharge signal the moment the reference voltage is reached. By switching over the reference voltage or using an additional comparator (window comparator) and a second reference voltage, the circuit becomes self-oscillating. The oscillation frequency is then determined, for example, by the period of time necessary for charging the capacitor to the reference voltage by the first transistor. Even if the capacitor as such has an accurate value, for example, because it is connected as a discrete component to a furthermore integrated sawtooth oscillator, the parasitic capacitance on the first capacitor terminal will still be a source of inaccuracy; certainly so if the external capacitor is to have a relatively small value. The parasitic capacitance Cpar is determined by the dimensions and properties of specifically the first transistor arranged as a current source and the Miller capacitance of the first discharge transistor. Furthermore, the wiring capacitance and the input capacitance of the comparator which is connected to the first capacitor terminal play a role. As a result, the frequency of the known sawtooth oscillator is not entirely fixed due to design and process tolerances.

The consequences may now be reduced according to the invention in that the sawtooth oscillator further includes: a second transistor of similar type to the first transistor, including a main current path with a blocked current transfer, a second discharge transistor of similar type to the first discharge transistor, including a second main electrode coupled in a node to the main current path of the second transistor, and including a first main electrode and a control electrode which are connected to the first main electrode and the control electrode respectively, of the first discharge transistor, a first current source coupled to the node, for producing a first current, a reference voltage source, a comparator having a first input connected to the node, a second input connected to the reference voltage source and having an output for supplying an essentially binary comparison signal of which a first or second value respectively, denotes that the voltage on the first input is smaller and larger respectively than the voltage on the second input, a second current source for supplying a second current, for a current switch for passing the second current to the first capacitor terminal in response to a transition from the first value to the second value of the clock signal and for preventing the second current flowing to the first capacitor terminal in response to a transition from the first to the second value of the comparison signal.

The second transistor and the second discharge transistor are a copy of the first transistor and the first discharge transistor respectively, so that the parasitic capacitance on the node is substantially equally as large as the parasitic capacitance on the first capacitor terminal. The second transistor is arranged in such a way that no current flows through it and that it functions as a dummy. The second transistor and the second discharge transistor, together with the first current source, the reference current source, the comparator, the second current source and the current switch, form a charge pump which compensates with a substantially equally large compensation charge for the charge that would disappear into the parasitic capacitance Cpar. The effect of the parasitic capacitance Cpar is thereby substantially eliminated. The charge pump components connected to the node, more specifically, the second transistor and the second discharge transistor, may also be scaled versions of the corresponding components of the sawtooth oscillator. As a result, the parasitic capacitance on the node is reduced by a specific scaling factor, but this may be compensated for by an adjusted ratio of the second current I2 to the first current I1. The effect of the input capacitance of the comparator on the means for generating the clock signal may be removed by selecting for the charge pump a comparator that has an about equally large input capacitance.

BRIEF DESCRIPTION OF THE DRAWINGS

These and other aspects of the invention will be described and explained with reference to the annexed drawing, in which.

In these drawing Figures components or elements having like function or connotation are denoted by like reference characters.

DETAILED DESCRIPTION OF THE PREFERRED EMBODIMENTS

Figure 1:
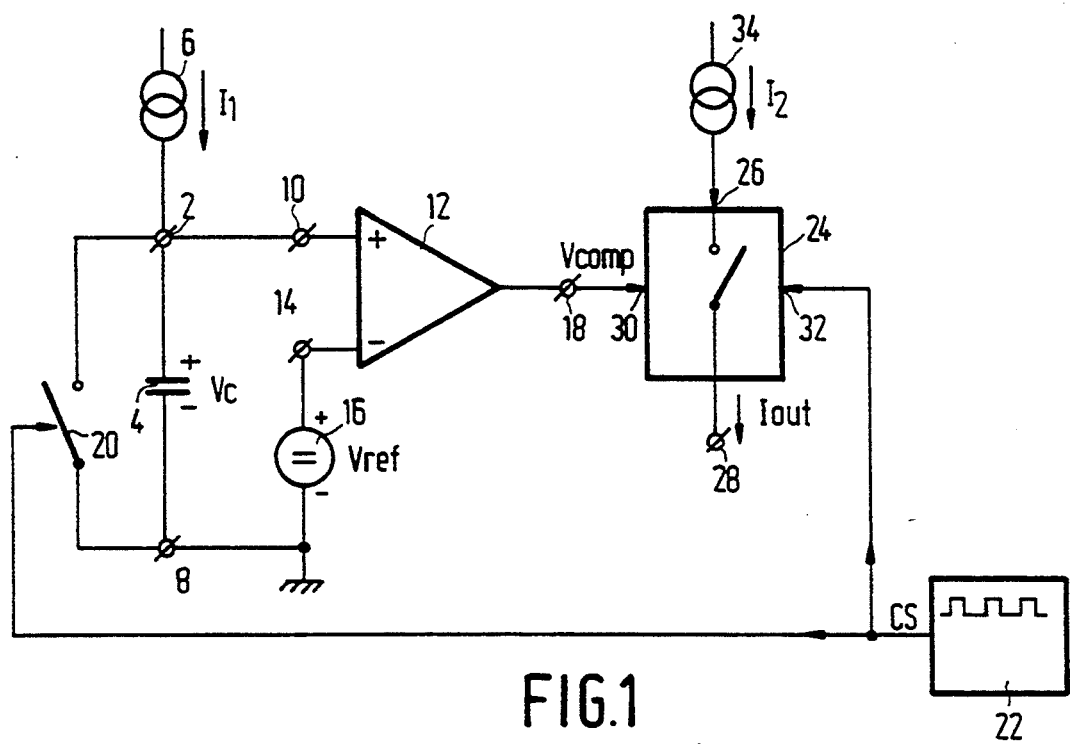
FIG. 1 shows a functional block diagram of a switched capacitor charge pump according to the invention.
Figure 2:
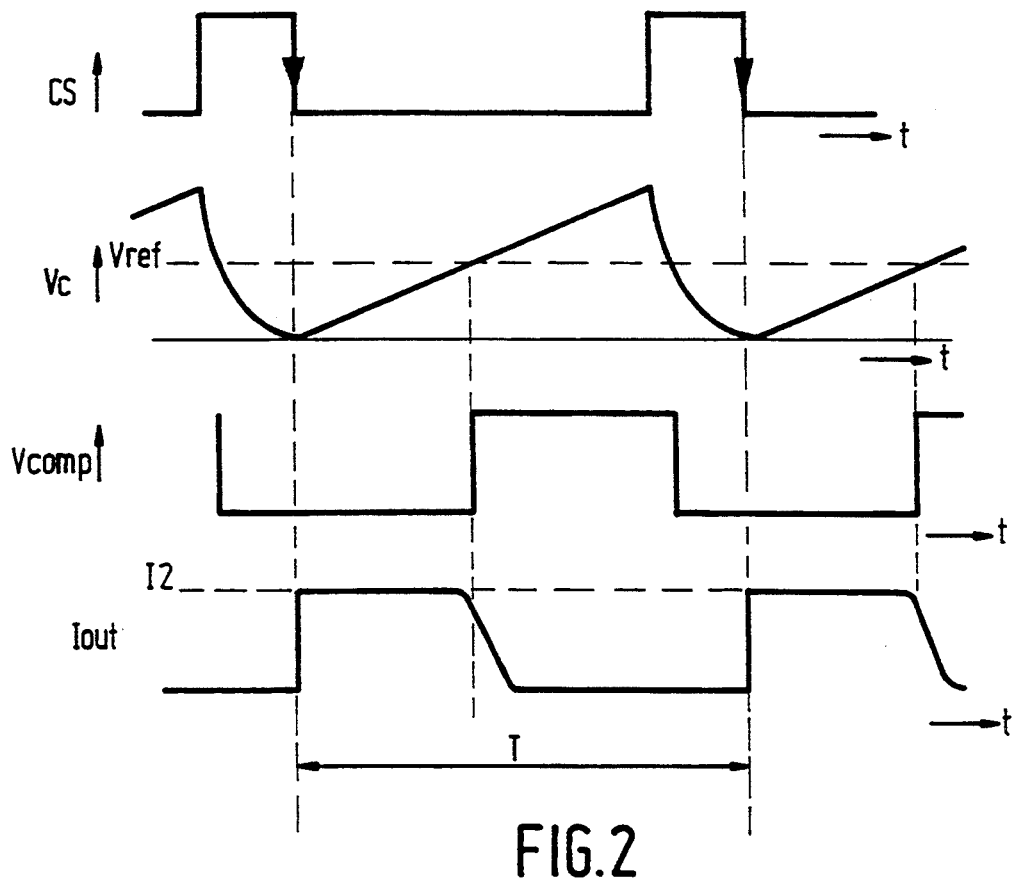
FIG. 2 shows signal diagrams in explanation of the operation of the switched capacitor charge pump shown in FIG. 1, FIG. 3 and FIG. 4 show embodiments of a switched capacitor charge pump according to the invention.

FIG. 1 shows the block diagram of a charge pump according to the invention. A number of signals whose signal shapes are represented in FIG. 2 occur in the charge pump. A first capacitor terminal 2 of a capacitor 4 is connected to a first current source 6 which charges the capacitor 4 with a first current I1, causing the capacitor voltage Vc across the capacitor 4 to increase with time. The second capacitor terminal 8 is connected to ground. The first capacitor terminal 2 is connected to a first input 10 of a comparator 12, a second input 14 of which is connected to a reference voltage source 16 which supplies a reference voltage Vref relative to ground. The comparator 12 has an output 18 for supplying a binary comparison signal Vcomp which adopts a low or high value respectively, if the capacitor voltage Vc on the first input 10 is smaller or larger respectively, than the reference voltage Vref on the second input 14. The capacitor 4 is periodically discharged by way of a discharge switch 20 connected to the first capacitor terminal 2 and the second capacitor terminal 8. The discharge switch 20 is controlled by a clock signal CS from a clock signal source 22, wherein a high or low value, respectively, of the clock signal CS closes or opens, respectively, the discharge switch. A current switch 24 includes a current input 26, an output terminal 28 for supplying an output current Iout and a first control input 30 and a second control input 32, to which are applied the comparison signal Vcomp and the clock signal CS respectively. The current input 26 is connected to a second current source 34 which applies a second current I2 to the current switch 24.

The current switch 24 passes the second current I2 to the output terminal 28 after a descending edge of the clock signal CS, that is to say, after the moment the capacitor 4 begins to be recharged by the first current source 6. The output current Iout then has the value I2. The current switch 24 blocks the current supply to the output terminal 28 in the case of an ascending edge of the comparison signal Vcomp, that is to say, when the capacitor voltage Vc exceeds the reference voltage Vref. The output current Iout then drops to zero again. This drop may be abrupt or gradual; the current Iout is to have dropped at any rate to zero with the next descending edge of the clock signal CS. The time elapsing between two descending edges in the clock signal CS is the clock period T. From the descending edge in the clock signal CS to the ascending edge in the comparison signal Vcomp a current I1 flows to the capacitor 4, while the capacitor voltage Vc increases to Vref. The charge dQ in the capacitor 4 is then equal to $C*Vref$, where C is the capacitance of the capacitor 4. During this period of time the output current Iout is proportional to the first current I1, because the following holds in that case: $Iout=I2=(I2/I1)*I1$. Over each clock period T the output current Iout therefore represents a charge portion dQ equal to: $dQ=C*Vref*(I2/I1)$.

The drop of the output current Iout from the value I2 to zero may also present a gradual behaviour. If this behaviour is symmetrical around the ascending edge of the comparison signal Vcomp, it does not affect the magnitude of the charge portion dQ, because the integral of the output current Iout is not changed by it over the entire clock period T.

Figure 3:
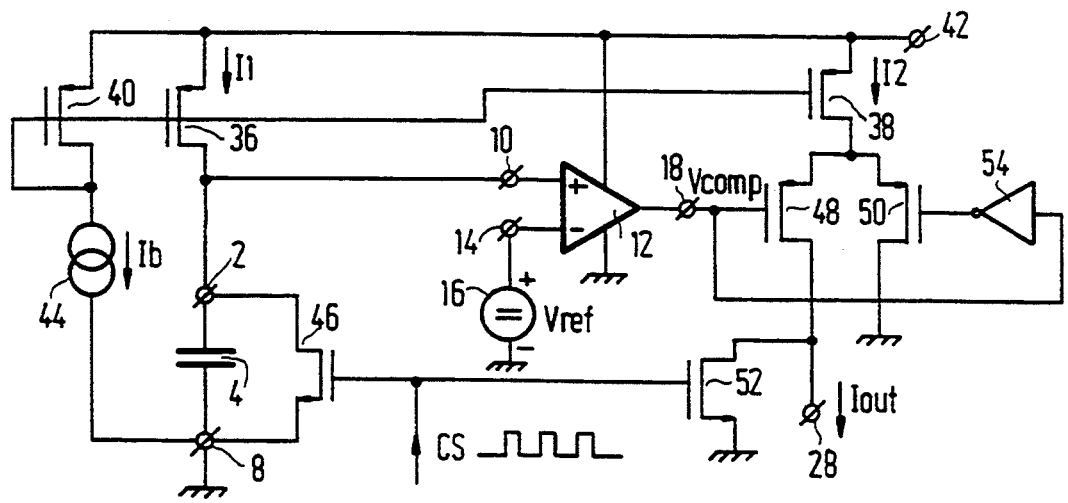

FIG. 3 shows a first embodiment of the charge pump. The first current source 6 and the second current source 34 from the block diagram of FIG. 1 are arranged here as a PMOS transistor 36 and a PMOS transistor 38 arranged as current sources and, together with a PMOS transistor 40 arranged as a diode, form a current mirror circuit. The sources of the PMOS transistors 36, 38 and 40 are connected to a positive supply terminal 42 and the gates of these transistors as well as the drain of PMOS transistor 40 are connected to a bias current source 44 which produces a current Ib. By scaling the PMOS transistors 36, 38 and 40, the mutual relation between the current I1 flowing through PMOS transistor 36 and I2 flowing through PMOS transistor 38 can be determined. The drain of the PMOS transistor 36 is connected to the first capacitor terminal 2 of the capacitor 4, whose second capacitor terminal 8 is connected to ground. The discharge switch 20 from the block diagram shown in FIG. 1 is arranged as an NMOS transistor 46, whose source, drain and gate are connected to the second capacitor terminal 8, the first capacitor terminal 2 and the clock signal source 22 respectively, for receiving the clock signal CS. The charge pump further includes a reference voltage source 16 and a comparator 12 which are arranged similarly to those shown in FIG. 1. The current switch 24 shown in FIG. 1 comprises the PMOS transistors 48 and 50 and the NMOS transistor 52. The sources of the PMOS transistors 48 and 50 are connected to the drain of PMOS transistor 38. The gate of PMOS transistor 48 is connected to the output 18 of the comparator 12. The gate of PMOS transistor 50 is connected to the output 18 via an inverter 54, so that only one of either of the two PMOS transistors 48 and 50 is conducting. The drain of the PMOS transistor 48 is connected to the output 28 and the drain of the PMOS transistor 50 is connected to ground. The source, drain and gate of the NMOS transistor 52 are connected to ground, the drain of PMOS transistor 48 and the clock signal generator 22 respectively, to receive the clock signal CS. As appears from FIG. 2, the comparison signal Vcomp becomes low while capacitor 4 is being discharged, so that the current I2 is passed to the output terminal 28 by PMOS transistor 48. The NMOS transistor 52, however, short-circuits the current supply to ground when capacitor 4 is being discharged. This achieves that the current Iout in the output terminal 28 adopts the shape as represented in FIG. 2.

Figure 4:
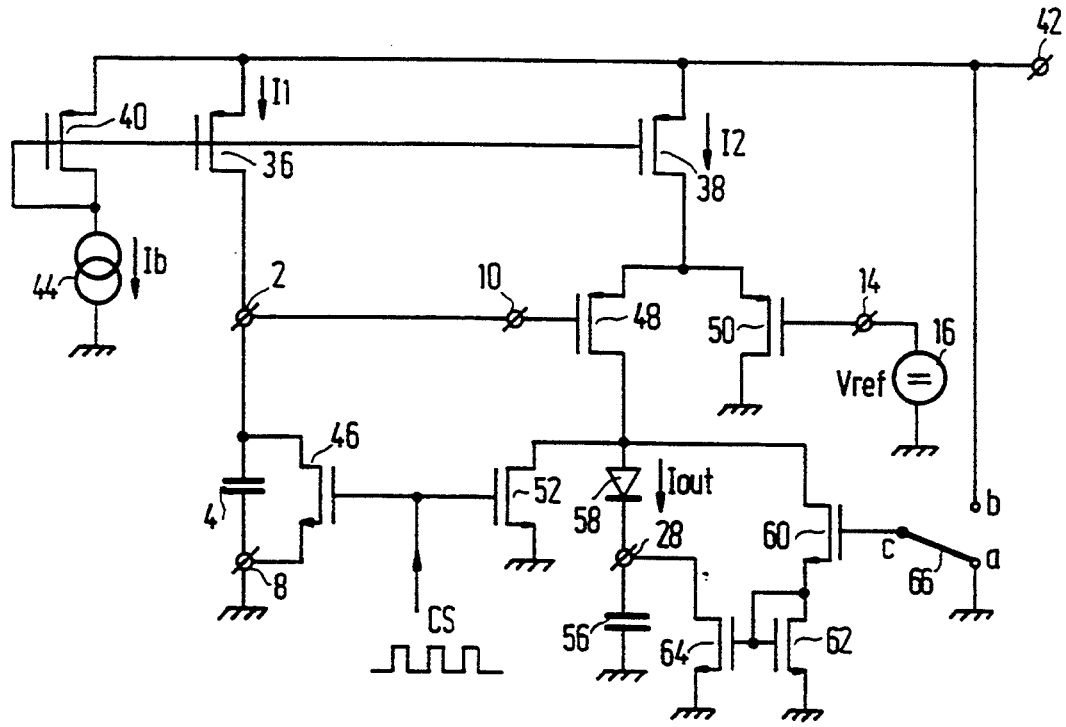

The embodiment of the charge pump shown in FIG. 3 may be simplified by letting the PMOS transistors 48 and 50 operate both as a comparator and as a current switch. The result is represented in FIG. 4. The gate of the PMOS transistor 48 is now directly connected to the first capacitor terminal 2 and the gate of the PMOS transistor 40 is directly connected to the reference voltage source 16. A capacitor 56 charged with charge portions dQ by the charge pump is connected to the output 28 by way of example. In that case a diode 58 prevents the capacitor 56 from being discharged unintentionally by the NMOS transistor 52. Once the capacitor 56 has been charged, it may be discharged again as desired by way of charge portions dQ. This is provided by the NMOS transistors 60, 62 and 64 and the selector switch 66. The NMOS transistors 62 and 64 are arranged as a current mirror, while the drain of NMOS transistor 64, which operates as an output of the current minor, is connected to the output terminal 28. The drain of NMOS transistor 62, which operates as an input of the current minor, is connected to the drain of the PMOS transistor 48 via the main current path of the NMOS transistor 60. The gate of the NMOS transistor 60 can be connected, by way of the selector switch 66, to ground (position a) or to the positive supply terminal 42 (position b). In position b the NMOS transistor 60 is conducting and the current I2 flows through the current minor to the output terminal 28, so that the capacitor 56 is discharged. In position a the current minor is inoperative and the capacitor 56 is charged.

Figure 5:
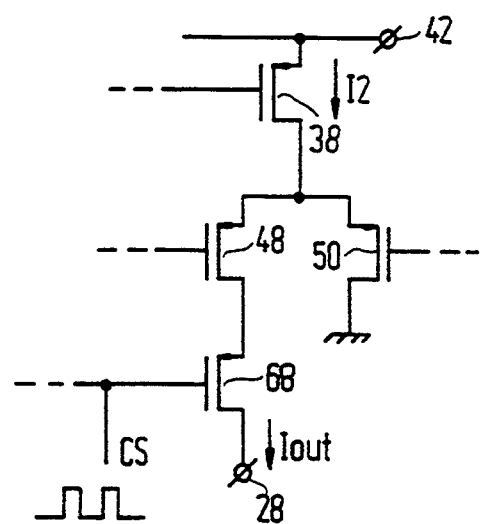
FIG. 5, FIG. 6 and FIG. 7 show details of alternative versions of the embodiment shown in FIG. 4.

FIG. 5 shows a first variant of the circuit of FIG. 4, in which the drain of the PMOS transistor 48 is connected to the output terminal 28 by way of the main current path of a PMOS transistor 68. The gate of the PMOS transistor 68 is connected to the clock signal CS, so that this transistor operates as a serial switch blocking the current supply to the output terminal 28 when the capacitor 4 is being discharged.

Figure 6:
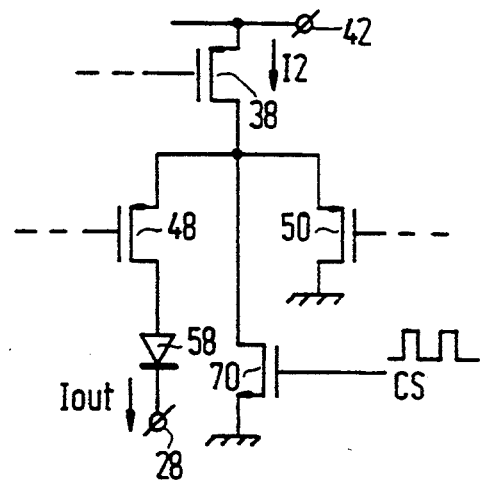

FIG. 6 shows a second variant of the circuit shown in FIG. 4. The blocking of the current supply to the output terminal 28 is now realized by use of an NMOS transistor 70, whose source, drain and gate are connected to earth, the drain of PMOS transistor 38 and the clock signal CS respectively.

Figure 7:
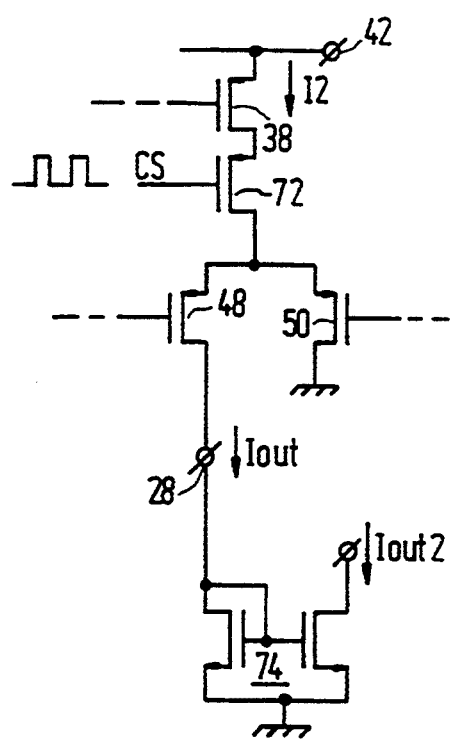

FIG. 7 shows a third variant of the circuit of FIG. 4. The blocking of the current supply to the output terminal 28 is realized here by use of a PMOS transistor 72, whose source, drain and gate are connected to the drain of PMOS transistor 38, the sources of the PMOS transistors 48 and 50 and the clock signal CS respectively. Furthermore, there is shown that the current Iout may be tapped by way of a current mirror 74 as desired.

Figure 8:
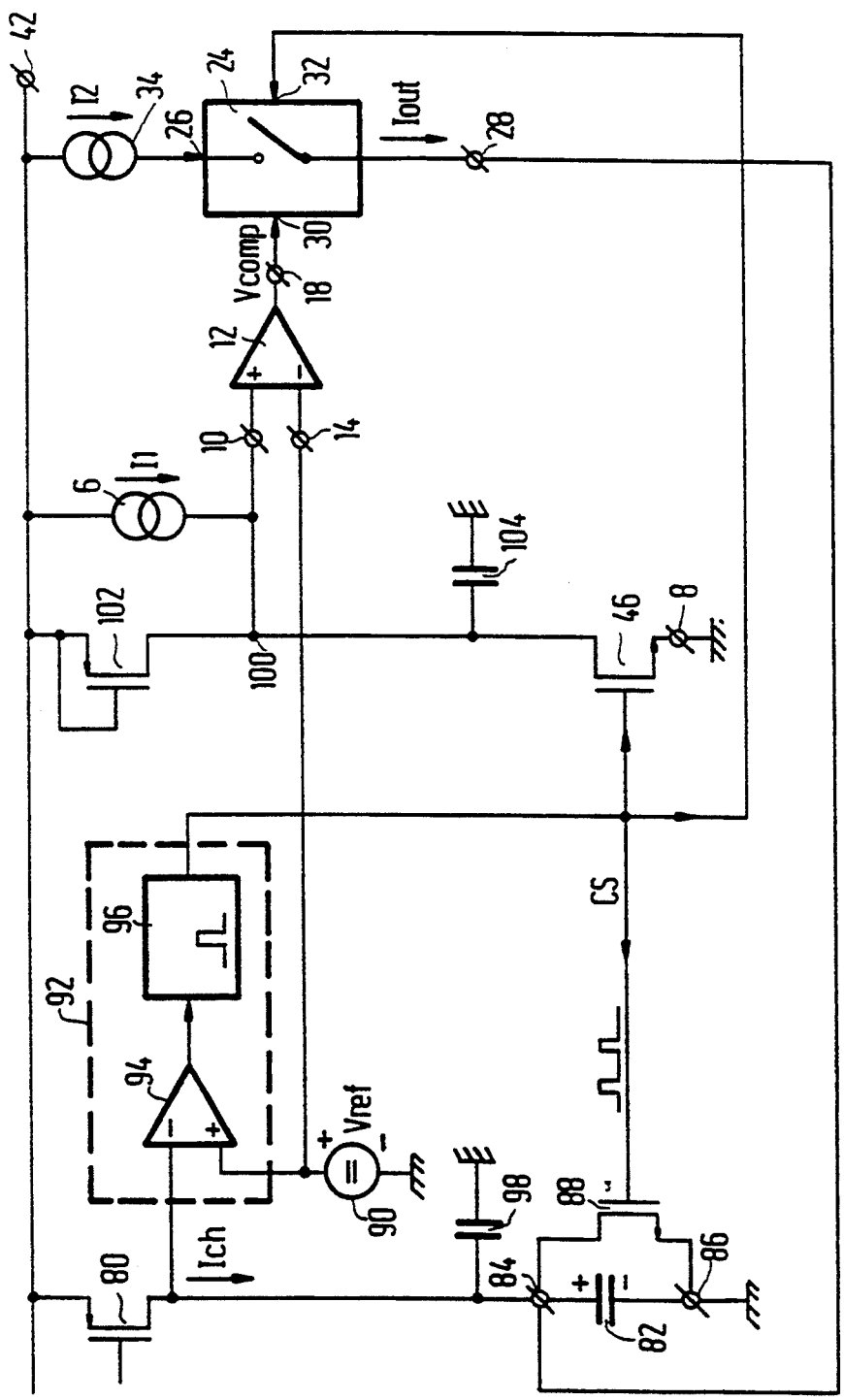
FIG. 8 shows a sawtooth oscillator comprising a switched capacitor charge pump according to the invention.

FIG. 8 shows a sawtooth oscillator in which the charge pump is used. The actual sawtooth oscillator is of a prior-art type and includes a PMOS transistor 80 arranged as a current source, a capacitor 82 which includes a first capacitor terminal 84 and a second capacitor terminal 86, an NMOS transistor 88 for discharging the capacitor 82, a reference voltage source 90 and a clock signal generator 92 which generates a clock signal CS. The clock signal generator 92 includes a comparator 94 comparing the voltage on the first capacitor terminal 84 with the reference voltage Vref of the reference voltage source 90. The comparator 94 triggers a one-shot generator 96 whose output signal functions as the clock signal. In lieu of the comparator 94 and the one-shot generator 96 alternatively a window comparator may be used in known fashion. The source and drain of the PMOS transistor 80 are connected to the first capacitor terminal 84 and the positive supply terminal 42 respectively. The gate of the PMOS transistor 80 may be supplied with a voltage in a similar manner to the one shown for the PMOS transistor 36 in FIG. 3. The second capacitor terminal 86 is connected to ground. The drain, source and gate of the NMOS transistor 88 are connected to the second capacitor terminal 86, the first capacitor terminal 84 and the clock signal CS respectively, of the clock signal generator 92. The clock period T and thus also the frequency of the sawtooth oscillator are determined, for example, by the period of time necessary for charging the capacitor 82 up to the reference voltage level Vref. The charge current Ich of the PMOS transistor 80 arranged as a current source flows not only to the capacitor 82 but also partly to a parasitic capacitor 98 present on the first capacitor terminal 84. The clock period T will thus be longer than could be expected. This effect is the more obvious when the capacitance of the parasitic capacitor 98 can no longer be discarded relative to the capacitance of the capacitor 82. The parasitic capacitance is formed, among other things, by the output capacitance of the PMOS transistor 80, the Miller capacitance of the NMOS transistor 88 and the wiring capacitance.

The charge pump includes the NMOS transistor 46, the first current source 6, the comparator 12, the second current source 34 and the current switch 24 which are connected between earth and the positive supply terminal 42 in similar manner to the one shown in FIGS. 1 and 3. The output terminal 28 is connected to the first capacitor terminal 84. The NMOS transistor 46 is connected in a node 100 to the first current source 6, the first input 10 of the comparator 12 and to the drain of a PMOS transistor 102 whose source and gate are connected to the positive supply terminal 42. The PMOS transistor 102 is a copy of the PMOS transistor 80, but does not supply current to the node 100. The NMOS transistor 46 is a copy of the NMOS transistor 88. The capacitance of the parasitic capacitor 104 on the node 100 is then substantially equal to the capacitance of the parasitic capacitor 98 on the first capacitor terminal 84. The parasitic capacitor 98 is charged up to the reference voltage level Vref. By using the same reference voltage in the charge pump, the parasitic capacitor 104 will have a same charge as the parasitic capacitor 98. By leading the current Iout to the first capacitor terminal 84, the charge which would otherwise flow into the parasitic capacitor 98 will be compensated for the charge pump. In this manner the influence of the parasitic capacitor is strongly reduced.

The charge pump may be realized by the embodiments already shown and discussed. When the charge pump shown in FIG. 4 is used, the diode 58 and the transistors 60, 62 and 64 are redundant. So is the NMOS transistor 52, because the NMOS transistor 88 carries out the same function. When the charge pump shown in FIG. 6 is used, the diode 58 will be redundant.

By selecting the comparators 94 and 12 of the same type, the mutual equality of the parasitic capacitors 98 and 104 is even further increased and so is the accuracy with which the influence of the parasitic capacitor 98 is reduced. The NMOS transistor 46 and the PMOS transistor 102 may also be scaled versions of the corresponding transistors 88 and 80. The same is possible with the comparators 94 and 12. The attendant capacitance reduction of the parasitic capacitor 104 may be adjusted by selecting an appropriate relation between the currents I2 and I1.

The invention is not restricted to the embodiments shown. In lieu of or in combination with the unipolar transistors shown, also bipolar transistors may be used, the emitter, collector and base then substituting for the source, drain and gate.

I claim:

1. A switched capacitor charge pump including
a capacitor having a first capacitor terminal and a second capacitor terminal,
charge means coupled to the first capacitor terminal, for charging the capacitor,
a clock signal source for generating a clock signal having a first and a second value,
a discharge switch, coupled to the first capacitor terminal and the second capacitor terminal, for recurrently discharging the capacitor by closing and opening of the discharge switch in response to the first and the second value, respectively, of the clock signal, characterized in that:
the charge means comprises a first current source coupled to the first capacitor terminal for supplying a first current to the capacitor, and the switched capacitor charge pump further includes a reference voltage source,
comparator having a first input coupled to the first capacitor terminal, for receiving a voltage, a second input coupled to the reference voltage source, an output for supplying a comparison signal having a first and a second value for denoting that the voltage is smaller and larger, respectively, than the reference voltage on the second input,
a second current source for supplying a second current,
an output terminal,
a current switch for passing the second current to the output terminal in response to a transition from the first value to the second value of the clock signal and for preventing the second current from flowing to the output terminal in response to a transition from the first to the second value of the comparison signal.

2. A switched capacitor charge pump as claimed in claim 1, characterized in that the comparator and the current switch comprise:
a first transistor and a second transistor arranged as a differential pair, and a third transistor, each transistor comprising a first main electrode, a second main electrode and a control electrode,
the first main electrodes of the first transistor and the second transistor being coupled to the second current source,
the control electrodes of the first transistor and the second transistor being coupled to the first capacitor terminal and the reference voltage source, respectively,
a first terminal being coupled to the second main electrode of the second transistor for producing a fixed potential,
the second main electrode of the first transistor being coupled to the output terminal, and
the first main electrode, the second main electrode and the control electrode of the third transistor being coupled to the second main electrode of the first transistor, the output terminal, and the clock signal source, respectively.

3. A switched capacitor charge pump as claimed in claim 1, characterized in that the comparator and the current switch comprise:
a first transistor and a second transistor arranged as a differential pair, and a third transistor, each transistor comprising a first main electrode, a second main electrode and a control electrode,
the first main electrodes of the first transistor and the second transistor being coupled to the second current source,
the control electrodes of the first transistor and the second transistor being coupled to the first capacitor terminal and the reference voltage source, respectively,
a first terminal being coupled to the second main electrode of the second transistor for producing a fixed potential,
the second main electrode of the first transistor being coupled to the first main electrode of the third transistor, and
the second main electrode and the control electrode of the third transistor being coupled to the output terminal and the clock signal source, respectively.

4. A switched capacitor charge pump as claimed in claim 1, characterized in that the comparator and the current switch comprise:
a first transistor and a second transistor arranged as a differential pair, and a third transistor, each transistor comprising a first main electrode, a second main electrode and a control electrode,
the first main electrodes of the first transistor and the second transistor being coupled to the second current source in a node,
the control electrode of the first transistor and the second transistor being coupled to the first capacitor terminal and the reference voltage source, respectively,
a first terminal coupled to the second main electrode of the second transistor for producing a fixed potential, the second main electrode of the first transistor being coupled to the output terminal, and the first main electrode being coupled to the node, the control electrode of the third transistor being coupled to the clock signal source, and a second terminal coupled to the second main electrode of the third transistor for producing a fixed potential.

5. A switched capacitor charge pump as claimed in claim 2, further including a diode for coupling the output terminal to the second main electrode of the first transistor.

6. A sawtooth oscillator, comprising:
a capacitor having a first capacitor terminal and a second capacitor terminal,
a first transistor arranged as a current source and having a main conduction path coupled to the first capacitor terminal for charging the capacitor,
means for generating a clock signal having a first and a second value in response to a voltage across the capacitor,
a first discharge transistor including a first and a second main electrode coupled to the second capacitor terminal and the first capacitor terminal, respectively, and including a control electrode coupled for receiving the clock signal for recurrently discharging the capacitor by rendering the first discharge transistor conductive and non-conductive in response to the clock signal, a second transistor, having a main current path with a blocked current transfer, a second discharge transistor including a second main electrode coupled in a node to the main current path of the second transistor, a first main electrode and a control electrode coupled to the first main electrode and the control electrode, respectively, of the first discharge transistor, a first current source coupled to the node, for producing a first current, a reference voltage source, a comparator having a first input coupled to the node, a second input coupled to the reference voltage source; and an output for supplying an essentially binary comparison signal of which a first and second value, respectively, denote that the voltage on the first input is smaller and larger, respectively, than the voltage on the second input, a second current source for supplying a second current, and a current switch for passing the second current to the first capacitor terminal in response to a transition from the first value to the second value of the clock signal and for preventing the second current flowing to the first capacitor terminal in response to a transition from the first value to the second value of the comparison signal.

7. The switched capacitor charge pump as claimed in claim 4, further including a diode for coupling the output terminal to the second main electrode of the first transistor.

8. A switched capacitor charge pump, comprising:

capacitive means, for storing a charge;

charge means for charging said capacitive means with a first current, said capacitive means exhibiting a first voltage thereacross when being charged by said first current;

clock means for providing a clock signal having a period, discharge switching means coupled to the capacitive means for recurrently discharging said capacitive means in response to the clock signal;

comparison means having a first input coupled to said capacitive means for receiving the first voltage across said capacitive means, a second input for receiving a reference voltage, and an output for supplying a comparison signal having a first value for denoting that the first voltage is smaller than the reference voltage, and a second value for denoting that the first voltage is larger than the reference voltage;

a second current source for supplying a second current;

an output terminal; and switching means coupled to the comparison means for controlling the flow of the second current to the output terminal in response to the clock signal and the comparison signal, such that the second current flows to the output terminal cyclicly with a period corresponding to the period of the clock signal and a pulse width dependent upon the charging time for charging the capacitive means to the reference voltage.

9. A circuit for recurrently producing a charge, said circuit comprising:

a) first current source means for providing a first current I1;

b) second current source means for providing a second current I2;

c) an output;

d) first switching means, connected between said second current source means and said output, and switchable between a conductive state in which said second current I2 is passed to said output and a non-conductive state in which said second current I2 is blocked from said output; and e) control means for switching said first switching means to produce a pulsating current I2 with a predetermined charge dQ on said output, said control means including (i) capacitive means, exhibiting a capacitance C, connected to said first current source means for being charged by said current I1, said capacitive means exhibiting a voltage thereacross when being charged by said current I1;

(ii) reference means for producing a reference voltage Vref;

(iii) comparing means for comparing the voltage across said capacitive means to said reference voltage and for switching said first switching means to the non-conductive state if the voltage across said capacitive means is equal to or greater than the reference voltage and for switching said first switching means to the conductive state when the voltage across said capacitive means is below said reference voltage; and (iv) discharging means for cyclically discharging said capacitive means within a time interval T;

said capacitance C, reference voltage Vref, and time interval T being selected such that said control means switches said first switching means to the conductive state and provides a pulsating current I2 on said output with said predetermined charge $dQ=(I2/I1)*C*Vref$ in said time interval T.

10. A circuit according to claim 9, wherein said capacitive means, first current source means, and voltage reference means are arranged such that said capacitive means is charged with said current I1 without changing said reference voltage Vref.

11. A circuit according to claim 10, wherein said discharging means includes:

a clock means for generating a clock signal with a period equal to said time interval T, a first value and a second value, said clock means being coupled to said first switching means; and a discharge switching means coupled to said capacitive means for recurrently discharging said capacitive means in each period T; and said first switching means switches said current I2 to said output with a period equal to the period T and a pulse width dependent on the charging time for charging said capacitive means to a voltage Vref with said current I1.

* * * * *